(12) United States Patent
Billiet et al.

(10) Patent No.: US 6,780,665 B2
(45) Date of Patent: Aug. 24, 2004

(54) PHOTOVOLTAIC CELLS FROM SILICON KERF

(76) Inventors: Romain Louis Billiet, 135A Malacca Street, Penang (MY), 10400; Hanh Thi Nguyen, 135A Malacca Street, Penang (MY), 10400

(*) Notice: Subject to any disclaimer, the term of this patent is extended or adjusted under 35 U.S.C. 154(b) by 49 days.

(21) Appl. No.: 10/230,710

(22) Filed: Aug. 23, 2002

(65) Prior Publication Data

US 2003/0041895 A1 Mar. 6, 2003

Related U.S. Application Data

(60) Provisional application No. 60/315,015, filed on Aug. 28, 2001.

(51) Int. Cl.$^7$ .............................................. H01L 31/18
(52) U.S. Cl. ............................ 438/57; 438/95; 438/63; 438/71; 438/98; 136/261; 136/258; 136/259; 136/252; 257/466; 257/431; 257/436
(58) Field of Search .............................. 438/97, 57, 63, 438/71, 98; 136/261, 258, 259, 252; 257/466, 431, 436

(56) References Cited

U.S. PATENT DOCUMENTS

| | | | |
|---|---|---|---|
| 5,800,611 A | * | 9/1998 | Christensen ................. 117/68 |
| 6,172,297 B1 | | 1/2001 | Hezel et al. |
| 6,200,377 B1 | | 3/2001 | Basilio et al. |
| 2002/0037232 A1 | * | 3/2002 | Billiet et al. .................. 419/37 |
| 2002/0037233 A1 | * | 3/2002 | Billiet et al. .................. 419/37 |
| 2002/0135108 A1 | * | 9/2002 | Billiet et al. ................ 264/669 |
| 2002/0158374 A1 | * | 10/2002 | Billiet et al. ................ 264/669 |
| 2002/0167118 A1 | * | 11/2002 | Billiet et al. ................ 264/432 |
| 2002/0190441 A1 | * | 12/2002 | Billiet et al. ................ 264/669 |
| 2003/0044302 A1 | * | 3/2003 | Billiet et al. .................. 419/36 |
| 2003/0058187 A1 | * | 3/2003 | Billiet et al. ................ 343/895 |

OTHER PUBLICATIONS

William S. Coblenz: 'The Physics and Chemistry of the Sintering of Silicon.' Journal of Materials Science, vol. 25, 1990 pp. 2754–2764.

Brosnan, J. and Snow, B. 'Recovery of Silicon Metal From Dross' Minerals and Energy Research Institute of Western Australia, Report No. 194, Project No. M258, Apr. 1998.

English Abstract for JP 63–049291, Mar. 1988.

\* cited by examiner

*Primary Examiner*—Alan Diamond
(74) *Attorney, Agent, or Firm*—Foley and Lardner

(57) ABSTRACT

The disclosure describes an economical and environmentally benign method to recover crystalline silicon metal kerf from wiresaw slurries and to shape and sinter said recovered crystalline silicon kerf into thin-layer PV cell configurations with enhanced surface texture for metallization and reduced optical reflection losses.

9 Claims, No Drawings

PHOTOVOLTAIC CELLS FROM SILICON KERF

CROSS-REFERENCE TO RELATED APPLICATIONS

This application claims priority to U.S. Provisional Patent Application Serial No. 60/315,015 filed on Aug. 28, 2001.

REFERENCES CITED

U.S. Patent Documents

| | | | |
|---|---|---|---|
| 6,172,297 | January 2001 | Hezel, et al. | 136/256 |
| 6,200,377 | March 2001 | Basilio, et al. | 106/486 |

Foreign Patent Documents

| | | |
|---|---|---|
| 63049291 | March 1988 | JP |

Other References

William S. Coblenz: "The Physics and Chemistry of the Sintering of Silicon"—Journal of Materials Science, Vol. 25, 1990, pp. 2754–2764

Brosnan, J, and Snow, B: "Recovery of Silicon Metal from Dross"—Minerals and Energy Research Institute of Western Australia, Report No. 194, Project No. M258, April 1998.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND

1. Field of Invention

The present invention relates to photovoltaic cells produced from silicon wafer sawing kerf. More specifically, the present invention relates to an improved process for the recovery of silicon from wafer sawing kerf and its application toward the fabrication of photovoltaic modules with improved light absorption and high fill factors.

2. Description of Prior Art

Photovoltaics (PV) technology is well established as a reliable and economical source of clean electrical energy. Having surpassed $1 billion in annual global sales, the photovoltaics industry is expected to add tens of GW/year of new generating capacity worldwide. In this context, future photovoltaic manufacturing facilities may be anticipated to produce on the order of 1 GW/year and will need to achieve a throughput on the order of 10 m² of PV modules per minute.

The photovoltaics industry has been using reject material from integrated circuit (IC) polysilicon and single crystal production. Although annual sales of the worldwide silicon PV module industry are about 400 times smaller than those of the IC industry, the PV industry consumes about 10% of the worldwide polysilicon production. As the photovoltaics industry is growing faster than its large cousin the microelectronics industry, this material becomes rarer and more expensive. In the last six or seven years, the price of polysilicon has doubled, and shortages have occurred. If production of polysilicon does not increase substantially, shortages of this material may create an acute problem.

More than 98% of semiconductor-grade polysilicon is produced by the trichlorosilane ($SiHCl_3$) distillation and reduction method, which is very energy intensive and produces large amounts of wastes, including a mix of environmentally damaging chlorinated compounds. About 80% of the initial metallurgical-grade silicon material is wasted during the process. In addition, semiconductor-grade polysilicon material far exceeds the purity requirements of the PV industry, and the cost is several times higher than what the PV industry can afford. It is obvious then that less complicated, less energy intensive, more efficient, and more environmentally benign methods need to be developed to meet the cost and quality requirements of the PV industry.

Most of the PV modules produced today are based on single-crystal silicon grown by the Czochralski (CZ) method. The CZ method begins by melting high purity silicon with a dopant in a quartz crucible. A small piece of solid silicon (the seed) is placed on the molten liquid in an inert gas atmosphere of about 1400 C. As the seed is slowly rotated and pulled from the melt, the surface tension between the seed and the molten silicon causes a small amount of the liquid to rise with the seed and cool into a single crystalline ingot with the same orientation as the seed. Crystal growth from silicon melt generates relatively few wastes. The main concern is the energy required and the amount of argon gas used during crystal growth.

After the silicon ingot is grown, it is sliced into wafers. Multiple wiresaw technology is now the preferred method of slicing large diameter ingots and the only viable technology for slicing 300 mm (12") wafers. Wiresaw technology has helped trim wafer thickness to as little as 200 micrometers and to minimize sawing kerf, the layer of silicon about 250–280 micrometers thick, that is lost per wafer. Depending on wafer thickness, kerf loss represents from 25% to 50% of the silicon ingot material.

In the wiresaw process, an optionally diamond-impregnated steel wire, about 180 micrometer in diameter running over control spindles, is placed under high tension and pushed onto the silicon ingot while an abrasive slurry composed of 25 micrometer or less silicon carbide (SiC) particles in a mineral oil or glycol-base is fed to the cutting zone between the wire and the workpiece.

Slurry management is critical to maintain uniform wafer quality. For PV silicon wafer manufacturing, the silicon kerf content in the slurry can be as high as 30% by weight, while for electronics-grade wafer manufacturing, it is rarely allowed to exceed 10%. Wafer slicing is one of the most expensive process steps in silicon solar cell manufacturing, accounting for over 65% of the total wafer manufacturing costs due to the large quantities of consumables (stainless steel wire and abrasive slurry) and the kerf loss. Each single wiresaw machine may require $150,000–250,000 per annum in silicon carbide replacement and slurry disposal costs.

If a method could be developed to produce solar-grade polysilicon by purifying the sawing kerf of semiconductor-grade ingots, enough polysilicon would be generated for over 300 MW/year of crystalline-silicon solar cells, i.e., more than two times the requirements of the current silicon solar-cell production.

BRIEF SUMMARY OF THE INVENTION

In accordance with the present invention the problems of the prior art are substantially overcome by providing an economical and environmentally benign method to recover crystalline silicon metal kerf from wiresaw slurries and to shape and sinter said recovered crystalline silicon kerf into thin-layer PV cell configurations with enhanced surface texture for metallization and reduced optical reflection losses.

OBJECTS AND ADVANTAGES

It is a primary object of this invention to provide an economic, simple, energy and material efficient process to mass-produce PV cells.

An additional object of this invention is to provide a method to fabricate PV cells that have a thickness of 10 micrometers or less. Standard silicon wafers are 200–500 μm thick, yet with improved optical designs, only 10 micrometers of silicon are required to capture all the available light. Hence one of the major technical hurdles the PV industry is trying to overcome is to economically produce thin-layer PV cells. At present this can only be achieved via sophisticated and costly silicon vapor deposition techniques. Since the granulometry of the silicon kerf particulates in the molding compound is in the sub-micrometer range, extremely thin wall geometries and design features can be achieved. Using the present invention PV cell thicknesses of the order of 10 micrometers and even less are attainable.

It is yet another object of the instant invention to provide a method of forming low-cost, high-quality front contacts on PV cells. Screen-printing is now the universally employed technique for contact formation. The problem with screen-printing, however, is that the throughput gains are attained at the expense of device performance. PV cell fill factors— the maximum power generated by the PV cell divided by the product of open circuit voltage and short circuit current— can be degraded by gridline resistance, contact resistance, and contact formation induced junction leakage and shunting. Hence gridline optimization using via fine line contacts can contribute to achieving high fill factors. By applying the present invention the front surface of PV cells can be fitted with molded-in microgrooves for optimized gridline metallization resulting in cells with higher fill factors.

Still another object of the present invention is to provide a method to increase PV cell efficiency, the latter being defined as the ratio of the electric power produced to the power of the incident light, or photons. The highest-efficiency silicon cell yet devised has a complex surface, consisting of inverted pyramids, resulting in reduced optical reflection losses. A significant benefit resulting from the combination of the fineness of the silicon kerf particulates in the molding compound and the shaping capabilities rendered possible by the present invention is the ability to achieve extremely complex surface textures contributing to the reduction of optical reflection losses. Such texture features can assume virtually any geometry that is moldable i.e. from which a molding core can be removed upon molding.

Yet another advantage of the present invention is the possibility to dope the silicon kerf molding compound with boron or phosphorus so as to obviate the need for post sintering doping operations.

BRIEF DESCRIPTION OF THE SEVERAL VIEWS OF THE DRAWINGS

Not applicable.

DETAILED DESCRIPTION OF THE INVENTION

The present invention uses silicon kerf as a raw material to fabricate PV cells. Therefore, the first step in the application of the present invention is the recovery of silicon kerf from wire saw slurries.

Abrasive slurries used in the wiresaw process are liquid suspensions of abrasive particles—silicon carbide or diamond grit—and abrasion products of the sawing operation, i.e. steel residue from the steel wires and silicon kerf from the silicon ingot. The liquid phase of the slurry is an organic or aqueous medium fulfilling the dual function of keeping the abrasive material in suspension and cooling the cutting zone between the wire and the workpiece.

The crystalline silicon metal chips generated during wafer slicing operations are an ideal raw material for the application of this invention. Produced by the abrading action of the wiresaw wire, the morphology of these silicon chips is essentially a submicrometer-sized particulate material. As it is a major objective of the PV industry to use ever thinner sawing wire, the granulometry of silicon kerf is likely to shift further into the sub-micrometer range. This is particularly beneficial to the application of this invention as small particles contribute to achieving PV cells with extremely small design features and improved definition.

The first step in the silicon kerf recovery process is the separation of the main solid constituents, i.e. silicon carbide abrasive, steel residue from sawing wire and silicon kerf, from the liquid phase of the slurry, using prior art solid-liquid separation techniques.

Current slurry purification technology uses gravity settling or centrifugation techniques and is primarily aimed at recovering and recycling the spent silicon carbide abrasive and the liquid coolant. A commercial slurry recovery system made by HCT Shaping Systems S.A. of Cheseaux, Switzerland utilizes a decanter-centrifuge system allowing recovery over 90% of reusable silicon carbide from glycol or oil-based coolants while silicon kerf is also recovered but disposed of as waste.

Another commercial slurry purification system made by Scientific Utilization Inc. of Huntsville, Ala., uses high energy electrical discharge initiated shock waves to separate the larger silicon carbide particles from the silicon metal fines.

It should be reemphasized at this point that both the aforementioned slurry recovery systems are designed with the primary objective of recovering the silicon carbide abrasive and coolant or to maintain the silicon kerf concentration in the slurry at acceptable levels while the silicon kerf is invariably discarded as waste.

In the application of this invention, the silicon kerf sludge generated by the aforementioned solid-liquid separation processes can, if desirable, be further concentrated by subsequent solid-liquid separation steps, using processes such as centrifugation, decanting, filtration, distillation, etc.

In a preferred embodiment of the present invention, silicon kerf is recovered from said sludges by froth flotation. Other separation-concentration techniques such as electrostatic separation can also be used but froth flotation has been found to be the more cost-effective method.

Froth flotation of silicon metal from organic and aqueous media is well known in the prior art. The literature abounds in references to surface-active organic materials having a high selectivity for silicon metal surfaces and which can be used as collectors in froth flotation. To name just a few types of surfactants used in silicon flotation are quaternary amines such as dodecyl trimethyl ammonium chloride and amino-hydroxysiloxanes. Many other surfactants exist and can be used in the application of this invention and enumerating them all would not materially contribute to the description of this invention.

The silicon kerf concentrate obtained by flotation or other concentration methods is now mixed with an organic thermoplastic compound or binder in order to produce a silicon kerf molding compound.

Significantly, it should be noted that the presence of any residual oil or glycol in the silicon kerf sludge does not in any way constitute an impediment to the successful application of the present invention as such residual oil or glycol can be integrated in the thermoplastic binder.

The number of combinations and permutations possible at this point are very great and anyone skilled in the art will be well aware of the number of possibilities that exist to them to obtain the desired characteristics of the binder. Enumerating all such possibilities would not materially contribute to the description of this invention. However, a typical formula for the organic binder mixture would be approximately one-third by weight of polyethylene, one-third by weight of paraffin wax, one-third by weight of beeswax with perhaps 0.1 through 0.2 percent of stearic acid and 0.05% of an antioxidant added.

The silicon kerf molding compound can be shaped into thin-layer PV cell configurations by well-known prior art techniques such as plastics injection molding but casting, doctor blading and calendering can also be used.

It should be noted here that the mold or die used to form the PV cells must be scaled up by multiplying the desired final dimensions of the proposed PV cells by a factor commensurate with the shrinkage upon sintering.

The organic binder is extracted from the green PV cell using well-known prior art techniques such as aqueous or organic solvent extraction, oxidative degradation, catalytic decomposition, vacuum distillation, wicking and the like, leaving behind a structure of silicon particulates and substantially devoid of organic material.

This binder-free structure can now be sintered to its final dense end configuration in accordance using prior art sintering techniques such as set forth in "The Physics and Chemistry of the Sintering of Silicon" by William S. Coblenz, as published in Vol. 25, 1990 of the Journal of Materials Science.

CONCLUSION, RAMIFICATIONS AND SCOPE

In conclusion, the present invention provides an economical and environmentally benign method to recover crystalline silicon metal kerf from wiresaw slurry and to shape and sinter said recovered crystalline silicon kerf into thin-layer PV cell configurations with enhanced surface texture for metallization and reduced optical reflection losses.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim as our invention:

1. A method for producing thin-layer photovoltaic cells from crystalline silicon kerf recovered from wiresaw slurries, comprising:
    a. separating the crystalline silicon kerf from said wiresaw slurries
    b. mixing said separated crystalline silicon kerf with an organic thermoplastic binder to produce a silicon kerf molding compound
    c. shaping said silicon kerf molding compound into green thin-layer PV cell geometries
    d. extracting substantially all the organic thermoplastic binder from the said green thin-layer PV cell geometries to obtain thin-layer PV cell preforms; and
    e. sintering said thin-layer PV cell preforms into dense end products.

2. The method of claim 1 wherein said silicon kerf is the by-product of wiresaw operations of crystalline silicon ingots and wafers.

3. The method of claim 1 wherein said silicon kerf is separated from wiresaw slurries by froth flotation.

4. The method of claim 1 wherein said silicon kerf is separated from wiresaw slurries by electrostatic precipitation.

5. The method of claim 1 wherein said silicon kerf has a particle size of 10 micrometers or less.

6. The method of claim 1 wherein said silicon kerf molding compound is doped with boron or phosphorus.

7. The method of claim 1 wherein the sintered thin-layer PV cells have a thickness of 10 micrometers or less.

8. The method of claim 1 wherein the sintered thin-layer PV cells have a surface texture to reduce light reflection.

9. The method of claim 1 wherein the sintered thin-layer PV cells have a surface which incorporates micro-grooves for enhanced gridline metallization.

* * * * *